APPARATUS AND METHOD FOR REDUCING AMPLIFIER DISTORTION
Filed Sept. 13, 1968
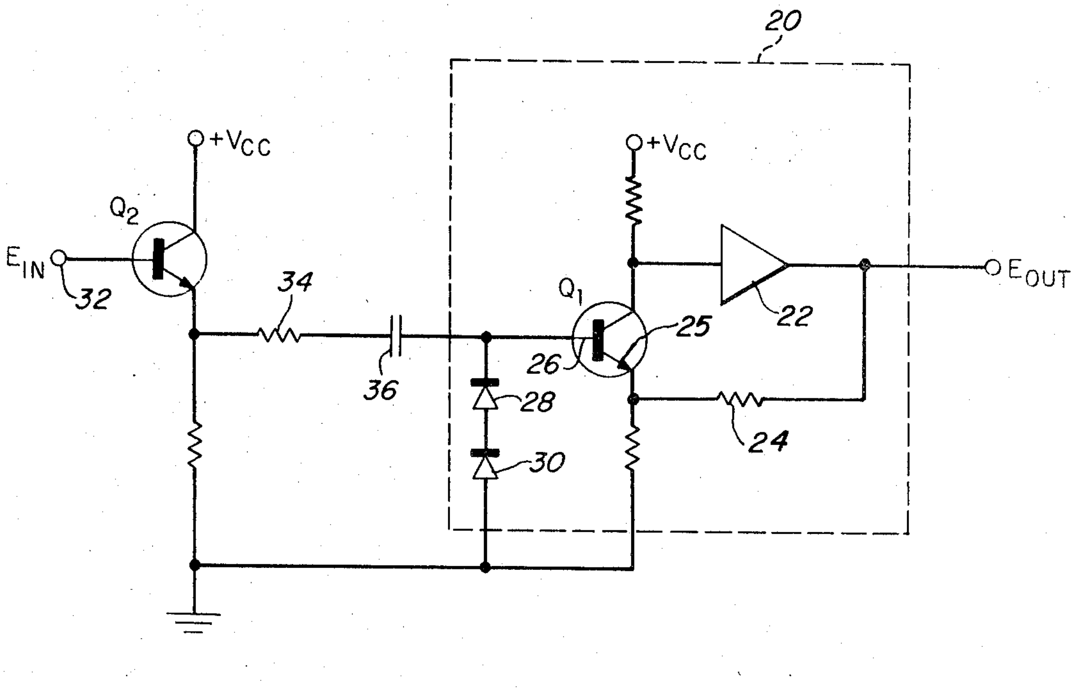
ROBERT GRODINSKY
INVENTOR.
BY Robert J. Schiller
ATTORNEY.

United States Patent Office 3,548,331

Patented Dec. 15, 1970

3,548,331

APPARATUS AND METHOD FOR REDUCING AMPLIFIER DISTORTION

Robert Grodinsky, Skokie, Ill., assignors to Acoustic Research, Inc., Cambridge, Mass., a corporation of California Filed Sept. 13, 1968, Ser. No. 759,621
Int. Cl. H03f 1/34
U.S. Cl. 330—24 5 Claims

ABSTRACT OF THE DISCLOSURE

An improved high-fidelity transistor amplifier using negative feedback to an input transistor. The input feedback termination is fed with an input signal from a low impedance source provided typically by an emitter-follower RC coupled to the base of one input transistor resulting in improved reduction of distortion. Additionally, the feedback termination is clamped to system ground by one or more diodes so that the operating point of the input transistor remains stabilized during possible excessive swings of the input signal.

This invention relates to amplifier circuits and particularly to very low distortion amplifiers particularly useful in audio high-fidelity circuits.

Where precise amplification of oscillatory waveforms is desired over a reasonably wide frequency range as in high-fidelity audio systems, the classical technique for reducing distortion due to non-linearities in the amplifier circuitry, is to employ negative feedback techniques. If the amplifiers are transistors then it has been suggested that feedback can be applied to either the base or emitter. It has also been stated that if the source impedance at the base is low, then most of the feedback current will flow into the source and not into the feedback amplifier.

However, it appears that the basic reduction in distortion is due to feedback current and not voltage and if the input stage source impedance is high, the distortion reduction will not be substantial where the feedback is applied to the emitter.

The overall feedback may also be applied around several amplification stages to an input transistor. In such case, if the input voltage is applied through an input capacitor and is permitted to swing excessively, the transistor may experience a shift in its operating point and where the overload is removed, a transient pulse from the capacitor will occur. This pulse creates audible distortion over an appreciable time interval.

It is therefore an object of the present invention to provide a transistor amplifier circuit in which distortion has been minimized. Other objects of the present invention are to provide such a circuit including an overall negative feedback loop to a transistor emitter and means for providing a low source impedance at the feedback termination so as to enhance the distortion reduction effect of the feedback; and to provide such a circuit including an overall negative feedback loop and means for stabilizing the operating point.

Yet other objects of the invention will in part be obvious and will in part appear hereinafter. The invention accordingly comprises the apparatus possessing the construction, combination of elements, and arrangement of parts, and comprises the several steps and the relation of one or more of such steps with respect to each of the others, all of which are exemplified in the following detailed disclosure, and the scope of the application all of which will be indicated in the claims.

For a fuller understanding of the nature and objects of the present invention, reference should be had to the following detailed description taken in connection with the accompanying drawing.

The drawing, partly in block and partly schematic, illustrates the principles of the present invention.

To effect the foregoing and other objects, the present invention generally comprises improvements in an amplifier wherein the input thereof is at a transistor stage, and which amplifier includes one or more negative feedback loops terminating at the emitter of that transistor stage, which improvements are the provision of a stabilized low impedance source feeding that transistor stage through a coupling having at least a series capacitance, and provision of means for stabilizing the operating point of the input transistor by drawing current through the series capacitance whenever input signals of a given polarity occur exceeding values which would tend to turn off the input transistor. Typically, the low impedance source can comprise an emitter follower stage and the means for stabilizing the operating point comprises one or more diodes in circuit between the base of the transistor and system ground.

Referring specifically to the drawing, there is shown an embodiment of the present invention including an amplifier 20 having at least transistor $Q_1$ as its input stage. In the form shown transistor $Q_1$ is an npn type in common emitter configuration and its collector is coupled to the input of second amplification stage or stages shown generally at 22 in block form. The output of stage 22 is fed back through feedback resistor 24 to emitter 25 of transistor $Q_1$. It will be appreciated that the output of stage 22 is inverted with respect to the input at base 26 of transistor $Q_1$ under open loop conditions so that the feedback is negative. Base 26 is connected to ground through appropriately poled diodes 28 and 30 in series with one another.

To provide a low impedance source into which base 26 can look, there is included typically transistor $Q_2$, shown as an npn type, which is arranged in common-collector configuration with its base coupled to terminal 32 at which a signal $E_{in}$ can be applied. The emitter of transistor $Q_2$ thus is connected to base 26, typically through an RC coupling comprising resistor 34 and capacitor 36 in series. The value of resistor 34 establishes a lower limit on the value of the source impedance, and typically will be 300Ω or less, for example. In operation, both transistors are biased into conduction so that a signal $E_{in}$ applied at the base of transistor $Q_2$ appears at the emitter of the latter. Essentially, then $E_{in}$ is also applied through resistor 34 and capacitor 36 to base 26 and an AC signal varying between limits will be amplified by transistor $Q_1$ and stage 22.

The output $E_{out}$ from stage 22 then is fed back to emitter 25 through resistor 24. The purpose of the feedback signal is to reduce distortion and it will be appreciated that such reduction is due to the feedback current through resistor 24. Because transistor $Q_2$ is in emitter follower configuration, its emitter serves as a stabilized low impedance source in series with the base emitter junction of transistor $Q_1$ through which feedback current may flow. Since overall distortion is reduced in proportion as the source impedance is lowered and feedback current increased, the distortion reduction is enhanced over systems not employing an introductory low impedance source of the type shown. For stability purposes, in order to control phase shift at high and low frequencies, series capacitive or inductive elements can be inserted between the emitter of transistor $Q_2$ and base 26. The use of a preliminary emitter follower to reduce source impedance serves to lower the distortion without an equivalent lowering of voltage gain.

It will be apparent that the emitter follower is merely exemplary in that it can be replaced with other devices acting as low impedance sources, such as a Darlington connection.

The feedback loop around transistor $Q_1$ and stage 22 is, of course, exemplary of such a loop around one or many stages of amplification. Normally if now $E_{in}$ applied at base 26 is a bipolar voltage which has a limited swing peak-to-peak, for the usual bias condition of the circuit on positive swings the collector-emitter current is increased and on negative swings is correspondingly decreased. The DC operating point on the transistor under these conditions remains constant. If however $E_{in}$ swings excessively, on negative swings the transistor cuts off and no current will flow. Because then there is more current flow in one direction than another through capacitor 36, a net charge will build up on the latter. This charge build-up then serves to shift the operating point of the amplifier and when the overload condition ceases, the capacitor charge dissipates as a transient pulse, causing audible distortion.

In order to avoid this phenomenon, the present invention includes one or more diodes such as 28 and 30, connecting base 26 to ground. These diodes are poled to draw current on the negative overload cycle of the input signal to base 26, sufficiently to balance the flow of base current due to the overload at positive cycles. The number of diodes used is based upon the sum of the inherent offsets of the diodes which will provide conduction at the proper input signal level. Alternatively, the same effect can be achieved using only a single diode with an independent biasing network Since certain changes may be made in the above method and apparatus without departing from the scope of the invention herein involved it is intended that all matter contained in the above description or shown in the accompanying drawing shall be interpreted in an illustrative and not in a limiting sense.

What is claimed is:

1. In a multi-stage amplifier circuit having an input transistor, a feedback loop from the output stage having a termination terminating at said input transistor for providing negative feedback to the latter, and a coupling for applying an input signal to said transistor through at least a series capacitor, the improvement comprising, unilateral current conducting means for stabilizing the operating point of said input transistor with respect to overload during swings of said input signal to said transistor which might tend to shift said operating point.

2. A circuit as defined in claim 5 wherein said means for stabilizing comprises at least one diode connecting the feedback termination to system ground and poled to draw current on only one polarity of said input signal.

3. A circuit as defined in claim 6 wherein the offset voltage of said one diode is established such that current flowing in the base of said input transistor caused by an excessive swing of said input voltage oppositely to said one polarity is balanced by current drawn through said diode when said voltage swings in a similarly excess manner in said one polarity.

4. The method of improving reduction of distortion in a multi-stage amplifier having an input transistor, and a feedback loop from the output stage terminating at said input transistor for providing negative feedback to the later and wherein an input signal is introduced into said amplifier hrough at least a series capacitor, and comprising the step of coupling the base of said input transistor to system ground through at least one unilateral current conductive element to stabilize the operaing point of said input transistor with respect to overload so that current can flow through said capacitor during excessive swings of an input signal to said transistor, regardless of the polarity of said signal.

5. In a multi-stage amplifier circuit having an input transistor, a feedback loop having a connection from the output stage terminating at said input transistor for providing negative feedback to the latter, and a coupling for applying an input signal to said transistor through at least a series capacitor, the improvement comprising, means providing a relatively low impedance source coupled to said feedback termination and unilateral current conduction means for stabilizing the operating point of said input transistor with respect to overload during swings of said input signal to said transistor which might tend to shift said operating point.

References Cited

UNITED STATES PATENTS

| | | | |
|---|---|---|---|
| 3,015,704 | 1/1962 | Behymer | 330—28X |
| 3,287,694 | 11/1966 | Romberg | 330—88UX |

ROY LAKE, Primary Examiner

J. B. MULLINS, Assistant Examiner

U.S. Cl. X.R.

330—28, 32

PO-1050
(5/69)

UNITED STATES PATENT OFFICE
CERTIFICATE OF CORRECTION

Patent No. 3,548,331 Dated December 15, 1970

Inventor(s) Robert Grodinsky

It is certified that error appears in the above-identified patent and that said Letters Patent are hereby corrected as shown below:

Column 3, line 47, the claim reference number "5" should read -- 1 -- ;

Column 4, line 3, the claim reference numeral "6" should read -- 2 --.

SIGNED AND SEALED MAR 9 1971

(SEAL)
Attest:

Edward M. Fletcher, Jr.
Attesting Officer

WILLIAM E. SCHUYLER, JR.
Commissioner of Patents